(12) United States Patent
Hsu

(10) Patent No.: US 7,084,691 B2
(45) Date of Patent: *Aug. 1, 2006

(54) MONO-POLARITY SWITCHABLE PCMO RESISTOR TRIMMER

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/895,513

(22) Filed: Jul. 21, 2004

(65) Prior Publication Data

US 2006/0017488 A1 Jan. 26, 2006

(51) Int. Cl.
*H03L 5/00* (2006.01)

(52) U.S. Cl. ...................... 327/308; 327/334

(58) Field of Classification Search ............... 327/308, 327/334, 494, 587, 588
See application file for complete search history.

(56) References Cited

U.S. PATENT DOCUMENTS

| | | | | |
|---|---|---|---|---|
| 3,271,591 | A | 9/1966 | Ovshinsky | 327/500 |
| 3,530,441 | A | 9/1970 | Ovshinsky | 365/113 |
| 3,886,577 | A | 5/1975 | Buckley | 257/3 |
| 3,921,105 | A * | 11/1975 | Brgelz | 327/308 |
| 3,947,801 | A | 3/1976 | Bube | 338/308 |
| 3,983,421 | A * | 9/1976 | Yogore | 327/308 |
| 4,146,673 | A | 3/1979 | Headley | 428/335 |
| 4,412,241 | A | 10/1983 | Nelson | 257/529 |
| 4,606,781 | A | 8/1986 | Vyne | 438/10 |
| 4,707,909 | A | 11/1987 | Blanchard | 438/10 |
| 4,717,886 | A | 1/1988 | Davis et al. | 336/252 |
| 4,870,472 | A | 9/1989 | Vyne | 338/92 |
| 5,081,439 | A | 1/1992 | Natzle et al. | 338/195 |
| 5,166,758 | A | 11/1992 | Ovshinsky et al. | 257/3 |
| 5,177,567 | A | 1/1993 | Klersy et al. | 257/4 |
| 5,296,716 | A | 3/1994 | Ovshinsky et al. | 257/3 |
| 5,335,219 | A | 8/1994 | Ovshinsky et al. | 369/288 |
| 5,341,328 | A | 8/1994 | Ovshinsky et al. | 365/163 |
| 5,359,205 | A | 10/1994 | Ovshinsky | 257/3 |
| 5,406,509 | A | 4/1995 | Ovshinsky et al. | 365/113 |
| 5,466,484 | A | 11/1995 | Spraggins et al. | 437/228 |

(Continued)

OTHER PUBLICATIONS

S.Q. Liu, N.J. Wu, A. Ignatiev, "*A new concept for non-volatile memory: the Electric-Pulse Induced Resistive change effect in colossal magnetoresistive thin film*", Proceedings of Non-Volatile Memory Technology Symposium 2001, San Diego, California, Nov. 2001, p. 18-24.

*Primary Examiner*—Long Nguyen
(74) *Attorney, Agent, or Firm*—David C. Ripma

(57) ABSTRACT

Using programmable resistance material for a matching resistor, a resistor trimming circuit is designed to reversibly trim a matching resistor to match a reference resistor. The programmable resistance materials such as metal-amorphous silicon metal materials, phase change materials or perovskite materials are typically used in resistive memory devices and have the ability to change the resistance reversibly and repeatable with applied electrical pulses. The present invention reversible resistor trimming circuit comprises a resistance bridge network of a matching resistor and a reference resistor to provide inputs to a comparator circuit which generates a comparing signal indicative of the resistance difference. This comparing signal can be used to control a feedback circuit to provide appropriate electrical pulses to the matching resistor to modify the resistance of the matching resistor to match that of the reference resistor.

36 Claims, 8 Drawing Sheets

U.S. PATENT DOCUMENTS

| | | | |
|---|---|---|---|
| 5,534,711 A | 7/1996 | Ovshinsky et al. | 257/3 |
| 5,536,947 A | 7/1996 | Klersy et al. | 257/3 |
| 5,541,869 A | 7/1996 | Rose et al. | 365/100 |
| 5,596,522 A | 1/1997 | Ovshinsky et al. | 365/113 |
| 5,635,893 A | 6/1997 | Spraggins et al. | 338/48 |
| 5,687,112 A | 11/1997 | Ovshinsky | 365/163 |
| 5,909,132 A * | 6/1999 | Trofimenkoff et al. | 327/101 |
| 5,912,839 A | 6/1999 | Ovshinsky et al. | 365/185.03 |
| 6,043,687 A | 3/2000 | Callahan, Jr. | 327/73 |
| 6,169,393 B1 | 1/2001 | Hashimoto | 323/354 |
| 6,204,139 B1 | 3/2001 | Liu et al. | 438/385 |
| 6,275,090 B1 | 8/2001 | Burger, Jr. et al. | 327/334 |
| 6,473,332 B1 | 10/2002 | Ignatiev et al. | 365/148 |
| 6,504,417 B1 | 1/2003 | Cecchi et al. | 327/308 |
| 6,531,371 B1 | 3/2003 | Hsu et al. | 438/385 |
| 6,703,885 B1 * | 3/2004 | Fan et al. | 327/308 |
| 2003/0001178 A1 | 1/2003 | Hsu et al. | 257/296 |

* cited by examiner

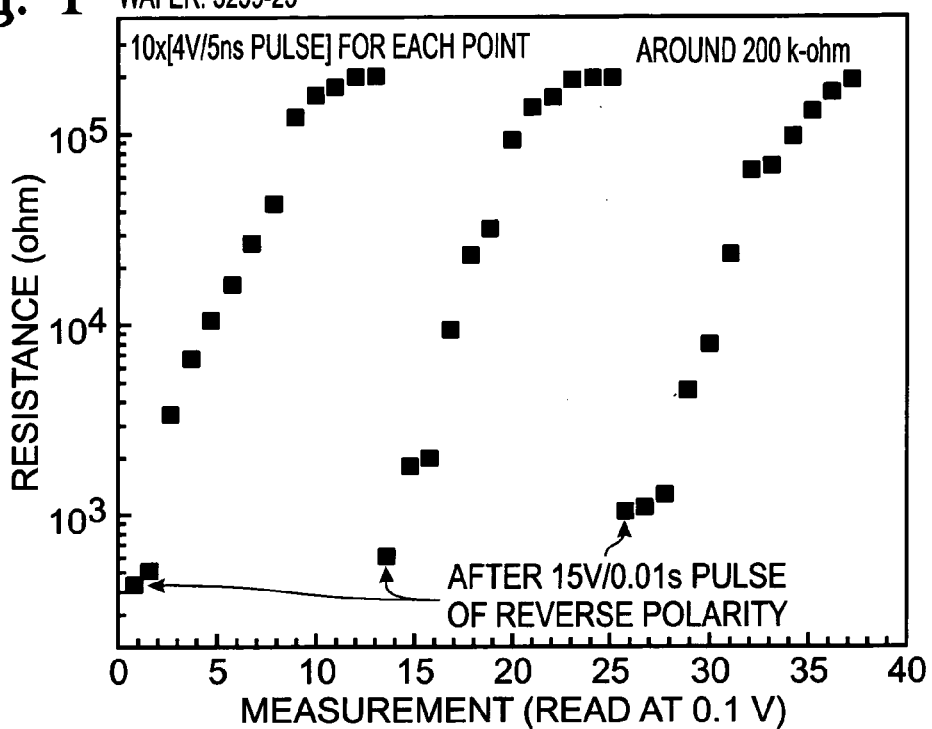
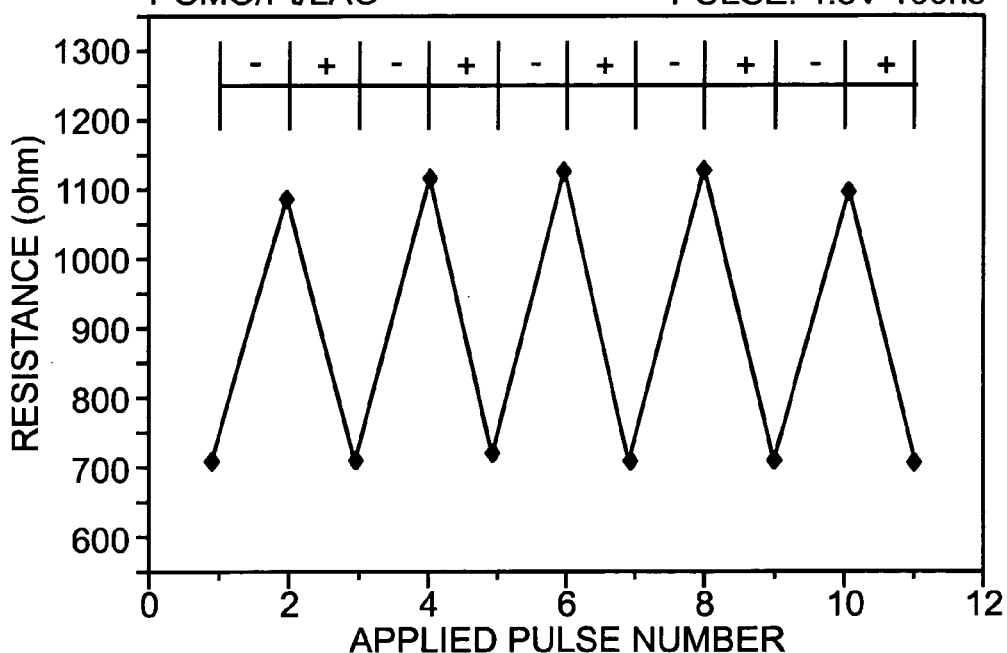

Fig. 7
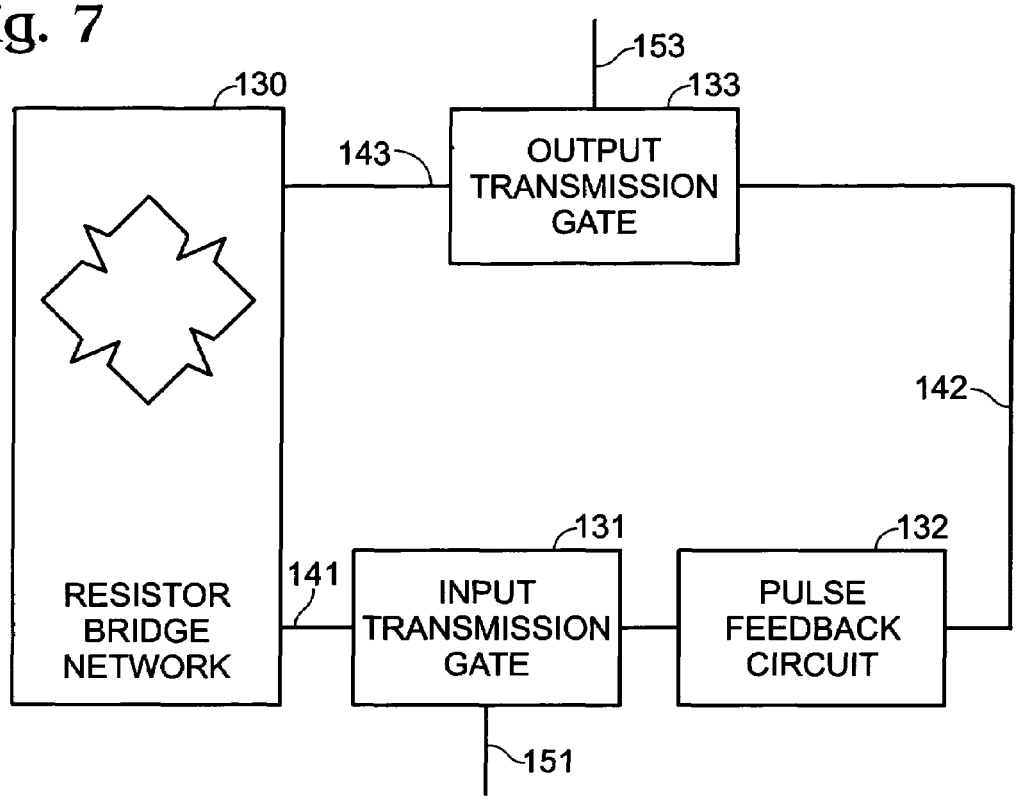
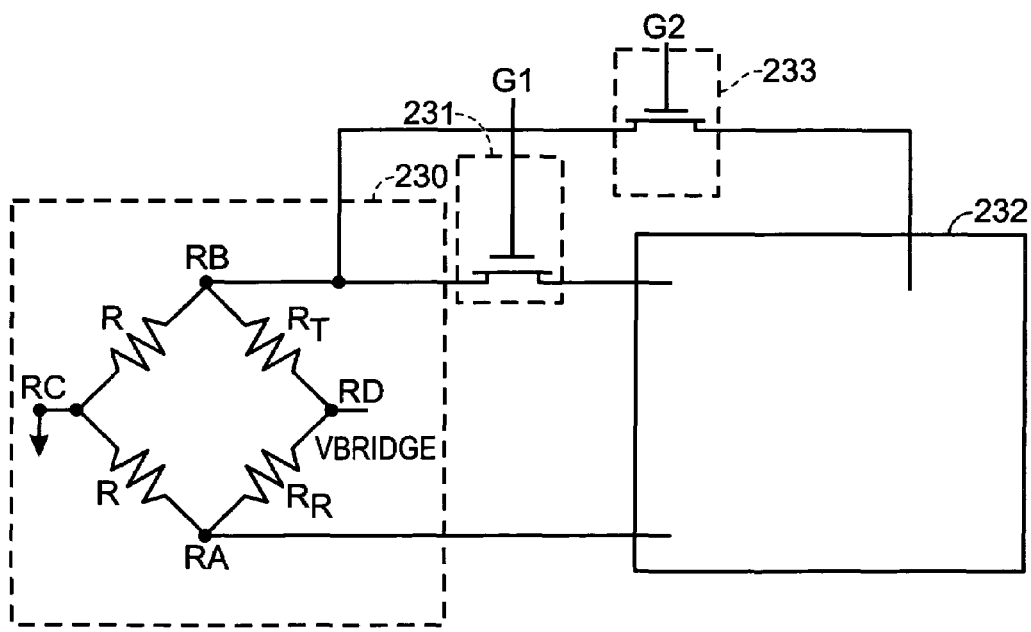

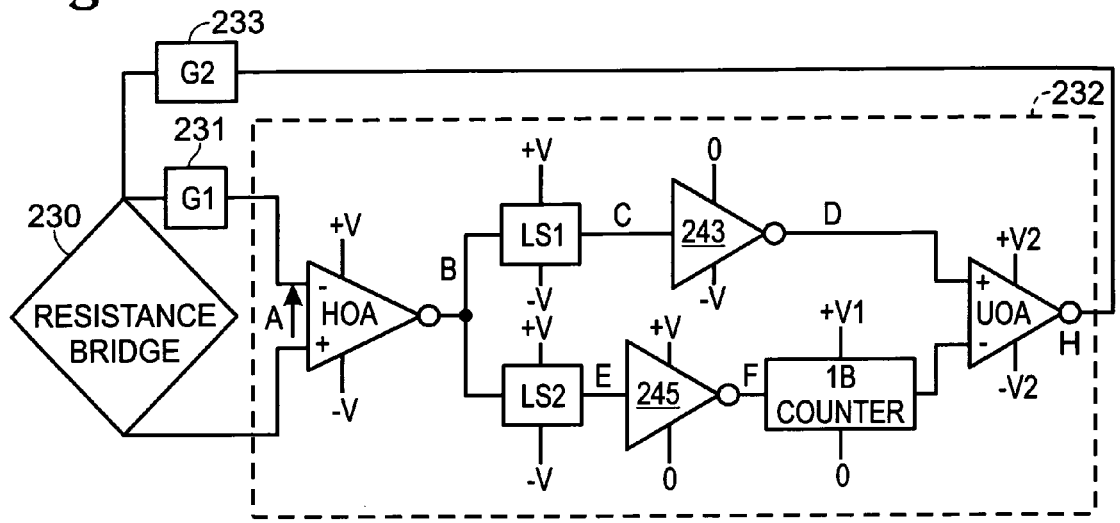
Fig. 8
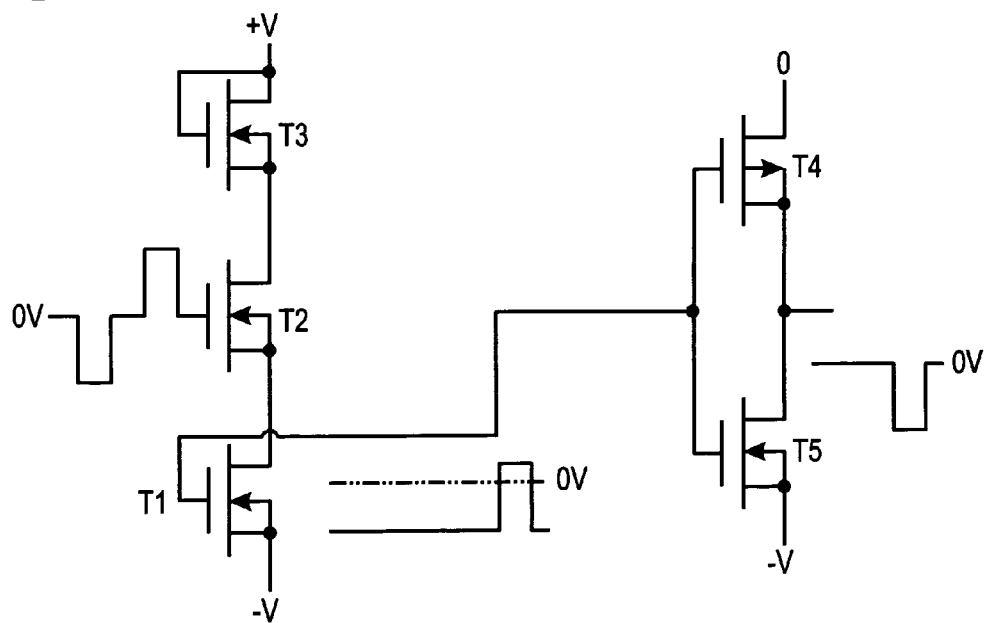
Fig. 9    LEVEL SHIFTER 1

LEVEL SHIFTER 2

MONO-POLARITY SWITCHABLE PCMO RESISTOR TRIMMER

FIELD OF THE INVENTION

This invention relates in general to a circuit for resistor trimming, and more particularly, to a circuit for reversible precision adjustment or matching of thin film programmable resistors.

BACKGROUND OF THE INVENTION

Resistors play an important role in microelectronic circuits. A resistor is an electrical component designed to have an electrical resistance independent of the applied current or voltage. Two important issues in the fabrication of resistors in microelectronic processing are the accuracy of the individual resistor and the accuracy of the ratio of a pair of resistors.

Many microeletronic circuits, such as precision analog amplifiers, require individual resistors to have a specific value to achieve the desired circuit performance level. Other circuits, such as differential amplifiers and analog-to-digital converters (ADC) or digital-to-analog converters (DAC), require accurate matching of two resistors, but not a specific value of individual resistor. Matching resistors means that the resistors are to have the same resistance value but each resistor needs not to be of any specific value.

Because process variations affect matched pair of resistors equally, high accuracy in matching resistors is easier to obtain in microelectronic fabrication process than in setting individual resistor at a certain resistance value due to manufacturing variations. But for some circuits, this degree of precision is still not adequate. For example, the resistance variations of merely 0.025 percent may compromise the linearity and accuracy of a 12-bit analog-to-digital converter. Thus maintaining the resistor-matching characteristics required for accurate circuit performance is of paramount importance in certain precision analog circuits.

Resistor trimming method is the most common method used to adjust or match the resistors in these circuits. The term "resistor trimming" means the fine adjustment of the resistance of a resistor in a circuit, either to reach a particular resistance or to match a reference resistor. The resistors could be trimmed by various mechanical, electrical, or chemical methods. For example, a resistor can be trimmed by laser shaping, fuse blowing, or by changing the conductivity of the resistor by activation of impurity doping.

In these prior art resistor trimming methods, the trimming action can be extremely difficult to reverse. The adjustment of the resistance in these methods often occurs only in one direction. For example, by laser trimming, the resistance can only increase due to the shaping or the shaving of the resistance material. By activation of impurity doping such as metal migration, the resistance can only decrease due to the migration of the impurities into the resistance material.

Over the years, new resistor and conductor materials have been developed. Specifically, materials used in resistive memory cells have programmable resistance and exhibit reversible resistance change based on external influences. For example, materials having electric pulse-induced-resistive-change (EPIR) effect used in multi-bit non-volatile memory devices can exhibit reversible and repeatable resistance changes under the influence of electrical pulses. The EPIR effect can be found in thin film colossal magnetoresistive (CMR) materials such as $Pr_{0.7}Ca_{0.3}MnO_3$ (PCMO), disclosed in U.S. Pat. No. 6,204,139 of Liu et al., and U.S. Pat. No. 6,473,332 of Ignatiev et al. Other examples of semiconductor resistive memory device materials are the metal-amorphous silicon-metal (MSM) electrical memory switch disclosed in U.S. Pat. No. 5,541,869 of Rose et al., and the electrical phase change materials such as TeGeSb, disclosed in U.S. Pat. No. 5,912,839 of Ovshinsky et al.

Thus it is advantageous to employ programmable resistance materials developed for resistive memory cells in resistor trimmer circuits for the advantage of reversibly trimmable resistance.

SUMMARY OF THE INVENTION

The present invention discloses a reversible resistor trimming circuit to match resistance of resistors made of programmable resistance material. By using materials that allow the resistance to be programmed reversibly, the present invention allows the adjustment of a matching resistor to match a reference resistor in both increasing and decreasing directions.

The programmable resistance materials employed in the present invention are materials exhibiting mono-polarity switchable property, meaning the resistance of the programmable resistance materials can be reversibly increased or decreased by an applied electrical signal of the same polarity. The programmable resistance materials disclosed in the present invention are often employed in resistive memory devices such as phase change materials, or perovskite materials exhibiting colossal magnetoresistive effect or high temperature superconducting effect. The phase change materials employed in resistive memory devices comprise at least one chalcogen and may include one or more transition metals. The perovskite materials exhibiting colossal magnetoresistive effect or high temperature superconducting effect employed in resistive memory devices are manganite materials such as PCMO.

In the first embodiment, the present invention reversible resistor trimming circuit comprises a resistor bridge network comprising a matching resistor and a reference resistor and a pulse feedback circuit. The reversible resistor trimming circuit first compares the matching resistor to the reference resistor and then generates a comparing signal indicative of the difference. This signal then controls the pulse feedback circuit output, a mono-polarity electrical pulse signal designed to adjust the resistance of the matching resistor toward that of the reference resistor. The process is repeated until the resistances of the matching resistor and the reference resistor are matched. By using a matching resistor made of programmable resistance materials, the present invention provides the resistor trimming in both directions, thus allows the adjustment of resistance over-trimming.

Depending on the programmable resistance materials used, the feedback circuit of the reversible resistor trimming circuit can provide the resistance adjustment pulses having the amplitude or duration directly related to the comparing signal. The pulse amplitude, the pulse duration and the number of pulses can also be controlled to improve the resistance overshoot.

In another embodiment of the present invention, the reversible resistor trimming circuit further comprises transmission gates between the resistor bridge network and the pulse feedback circuit to isolate the signals. The pulse feedback circuit can further comprise two branch circuits with level shifter for providing the appropriate amplitude and duration for the mono-polarity electrical pulse signal output.

BRIEF DESCRIPTION OF THE DRAWINGS

FIG. 1 shows the resistance function of a bi-polarity PCMO material.

FIG. 2 shows the reversibility of the resistance of a bi-polarity PCMO material.

FIG. 7 shows the block diagram of another embodiment of the present invention reversible resistor trimming circuit.

FIG. 8 shows a detailed block circuit of the present invention reversible resistor trimming circuit.

FIG. 9 shows an embodiment of a level shifter in the present invention.

DETAILED DESCRIPTION OF THE INVENTION

Figure 3:
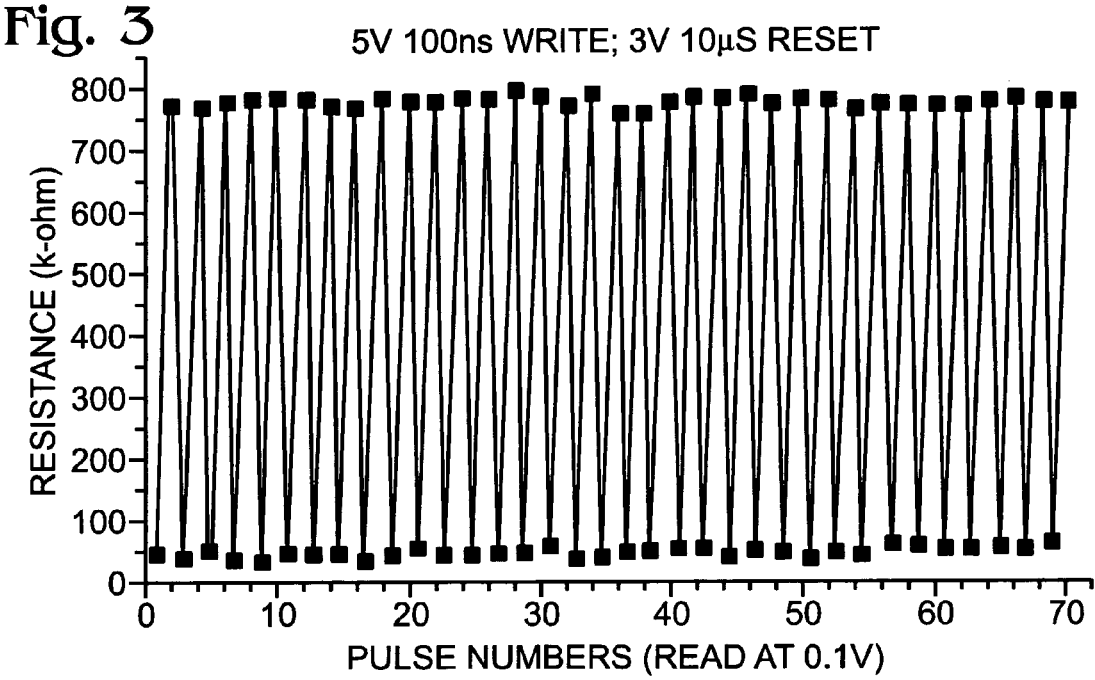
FIG. 3 shows the reversibility of the resistance of a mono-polarity PCMO material.

The present invention discloses a novel circuit to reversibly trim the resistor to match a reference resistor in electronics circuits by the use of programmable resistance material.

In the prior art resistance trimmer circuit, the act of resistor trimming often cannot be reversed due to the irreversibility of the resistance material or the trimming process. The prior art resistance material or the trimming process usually only allows the resistance to either increase or decrease, but not both.

For example, by laser trimming, the resistance can only increase due to the shaving or the shaping of the resistive material. Therefore the resistor material is designed with a very low initial resistance value, and is then trimmed to the appropriate resistance. If the resistor is trimmed excessively, the circuit cannot be repaired because the resistor cannot be reversed to the previous lower value. Similarly, the resistor trimming process is irreversible in fuse blowing or in Zener diode zapping.

Another prior art method for resistor trimming is to change the resistance of the materials by impurity diffusion, such as n-type (e.g. phosphorous) doped or p-type (e.g. boron) doped or metal (e.g. aluminum) doped silicon. The initial resistance of the silicon film is normally high, and can then be decreasingly adjusted (or trimmed) by diffusing the impurity into the silicon. Again, the resistance can only decrease due to the migration of the impurity into the resistor, and the trimming action cannot be reversed.

Recent developments of RRAM (resistive random access memory) circuit have introduced a class of materials (programmable resistance material) that has electrical resistance characteristics that can be changed by external influences. From an electrical point of view, this class of programmable resistance materials can be modeled as a programmable variable resistor. The variable resistor can be programmed to have high resistance or low resistance, or any intermediate resistance values. The different resistance values of the variable resistor represent the information stored in the RRAM circuit.

A reversible resistor trimming circuit has been disclosed in a co-pending application "PCMO resistor trimmer" by the same inventor, hereby incorporated by reference. The present invention discloses another reversible resistor trimming circuit specifically for programmable resistance materials exhibiting mono-polarity switchable property, meaning the resistance of the programmable resistance materials can be reversibly increased or decreased by an applied electrical signal regardless of polarity, but preferably of the same polarity.

A typical programmable resistance material exhibiting mono-polarity switchable property is a chalcogenide material. Chalcogenide alloys exhibit two different stable reversible structural states, namely an amorphous state with high electrical resistance and a polycrystalline state with lower electrical resistance. Typically, a high melting temperature with a quick quenching time will freeze the material into an amorphous state, and a low melting temperature with a slow cooling time will restore the material into a polycrystalline state. The energy can be applied by resistive heating using electrical current pulses. Thus, a short, high amplitude current pulse will create an amorphous state since the high amplitude will offer high current, leading to high temperature well above the melting temperature, and a short duration pulse to quickly drop the temperature, forcing the material into an amorphous state. A long, low amplitude current pulse will create a polycrystalline state since the low amplitude will offer lower current, leading to a temperature just about the melting temperature, and a long duration pulse to slowly drop the temperature, allowing the material to crystallize. In this example of programmable resistance material, the mono-polarity switchable property implies an independence of the pulse polarity. In other words, the polarity of the electrical pulses is irrelevant since the resistance states of the chalcogenide alloys change with the square of the current pulses.

Another example of programmable resistance material exhibiting mono-polarity switchable property is $Pr_{0.7}Ca_{0.3}MnO_3$ (PCMO). The resistance of certain PCMO materials can be changed (increase or decrease) by the application of an electrical pulse. The resistance change depends on many parameters: the pulse amplitude, the pulse waveform, the pulse duration or the history of the change of the resistance. However, while the resistance changes of chalcogenide materials do not depend on the polarity of the applied electrical pulses, the resistance changes of PCMO materials can be adjusted by the selection of suitable polarity, amplitude or duration. FIG. 1 shows the resistance of a thin film PCMO material as a function of the number of applied voltage pulses. This PCMO thin film resistor was deposited on Pt on a $LaAlO_3$ (LAO) or a $YBa_2Cu_3O_7$ (YBCO) substrate with two electrodes (made of Ag, Au, Pt or other metal) on the top surfaces of the PCMO and the Pt respectively. This figure shows that the resistance of a PCMO material can be reversibly adjusted to any value within certain resistance limits, from 400 Ω to about 200 kΩ in this sample. The resistance limits can be modified and fabricated based on the thin film properties such as thickness and microstructure. Each point in the resistance curves of FIG. 1 consists of 10 pulses of 4 V, 5 ns voltage pulses in the direction of increasing resistance. As shown in FIG. 1, the PCMO resistance increases steadily with the number of applied pulses. The voltage pulse applied to the PCMO thin film resistor is preferably ranging from 1 fs to 1 s, and more preferably from 1 ns to 11s, and preferably ranging from 100 mV to 100V, and more preferably from 100 mV to 20V. When the polarity of the voltage pulse is reversed, the resistance of the resistor decreases. The resistance of the PCMO thin film sample drops from a high resistance of 200 kΩ to a lower value of 400 Ω after the application of a 15 V, 0.01 s voltage pulse with a reverse polarity. Usually for PCMO materials, the negative pulses decrease the resistance. The rate of resistance change depends on the pulse width and pulse amplitude. Thus for a pulse with very narrow pulse width or very small pulse amplitude, the resistance change by each pulse is very small. The negative pulse of 15 V, 0.01 s reduces the resistance from 200 kΩ to 400 Ω while the 10 positive pulses of 4 V, 5 ns only increase the resistance by about 4 to 6 kΩ. FIG. 2 shows the reversibility of the PCMO material. A series of alternate polarity pulses of 4.8 V, 100 ns is applied to the PCMO thin film, and drives the PCMO resistance repeatably from a low resistance of 700 Ω to a higher resistance of 1100 Ω0 and back.

The bi-polarity switchable property, meaning reversing the polarity of the applied electrical pulses reverses the direction of resistance change, of PCMO materials has been employed in a co-pending application "PCMO resistor trimming" of the same inventor.

Together with the bi-polarity switchable property, PCMO materials also exhibit mono-polarity switchable property, meaning the same polarity of the applied electrical pulses can be used to reverse the direction of the resistance change. The direction of resistance change can thus be executed by the correct pulse amplitudes or pulse durations, all with the same polarity.

Figure 4:
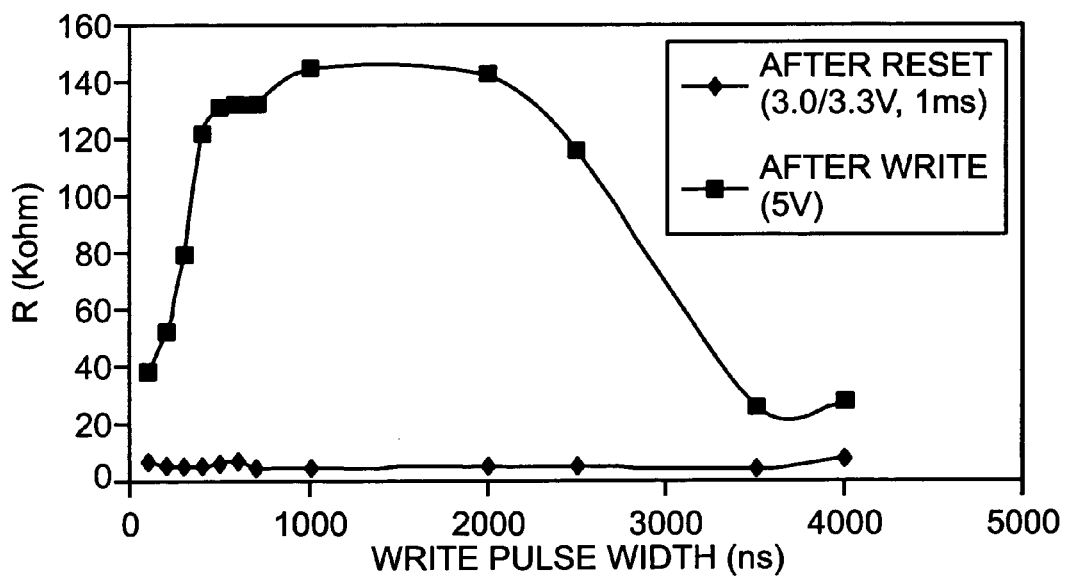
FIG. 4 shows the resistance of a mono-polarity PCMO material as a function of pulse widths.
Figure 5:
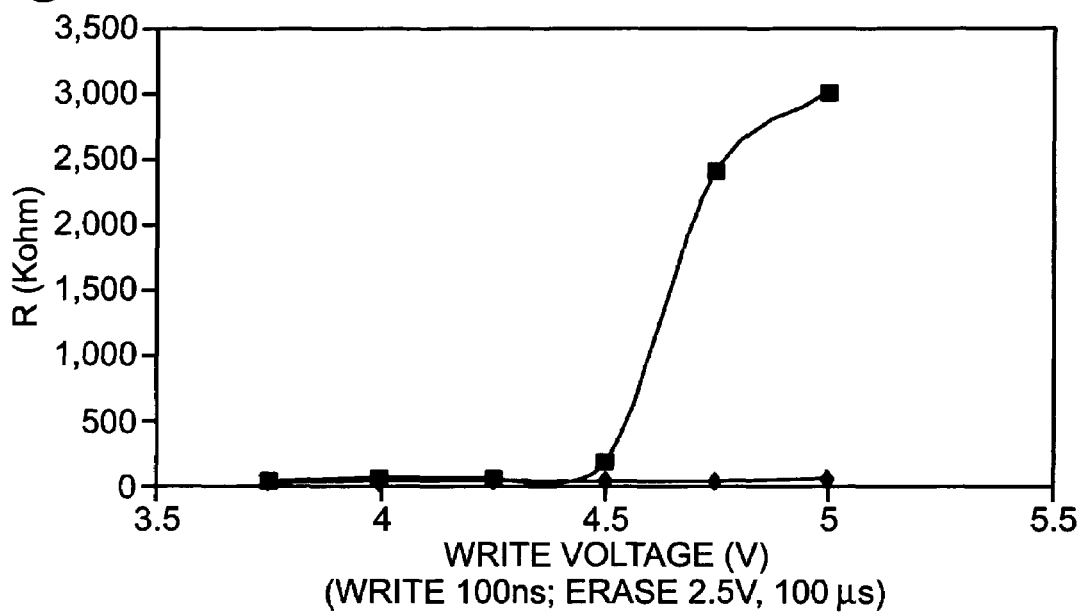
FIG. 5 shows the resistance of a mono-polarity PCMO material as a function of pulse amplitudes.

Showing in FIG. 3 is the mono-polarity switchable property of the resistance of certain PCMO resistor, such as MOD PCMO. The resistance can be increased with a narrow width (10 ns to 10 μs, 100 ns in this figure), high amplitude (5V) voltage pulse and decreased using the same polarity but much wider (1 μs to 1 ms, 10 μs in this figure) and lower amplitude (2V to 6V, or preferably 2V to 4V, 3V in this figure) voltage pulse. The ratio of high resistance to low resistance may be as large as three orders of magnitude. FIG. 4 shows the programmability of the PCMO resistance having mono-polarity property. The resistance can be increased or decreased depending on the pulse width of the applied pulses with the same pulse polarity and pulse amplitude (5V for writing). The resistance can be increased slowly with a pulse width increasing in the range from 100 to 1000 ns, and decreased slowly with a longer pulse width in the range from 2000 to 3500 ns. For reset, the resistance can be brought down to a low value (less than 10 kΩ) with a reset pulse of 3 to 3.3V, 1 msec. Similarly, FIG. 5 shows the increase of the resistance as a function of pulse amplitude (with the same polarity) at a given pulse width.

Thus similar to chalcogenide materials, PCMO materials can exhibit mono-polarity switchable property in programming the resistance with electrical pulses. By applying a series of very narrow pulse width and low pulse amplitude voltage pulses with the same polarity, the resistance of a PCMO resistor can be accurately adjusted to a desired value. A preferred resistance adjusting process would be first resetting the resistance to a low value by a long pulse having pulse width of 10 μs to 10 ms and amplitude of 2V to 6V, preferably 2V to 4V, and followed by a series of narrow (5 ns to 100 ns) and low amplitude (2V to 6V, preferably 2V to 4V) pulses to make a precision adjustment of the resistance value.

The present invention employs this class of materials, the programmable resistance materials exhibiting mono-polarity switchable property, in a reversible resistor trimming circuit. By using the materials that allow the resistance to be programmed reversibly, the present invention allows the adjustment of a matching resistor to match a reference resistor in both increasing and decreasing directions.

Figure 6:
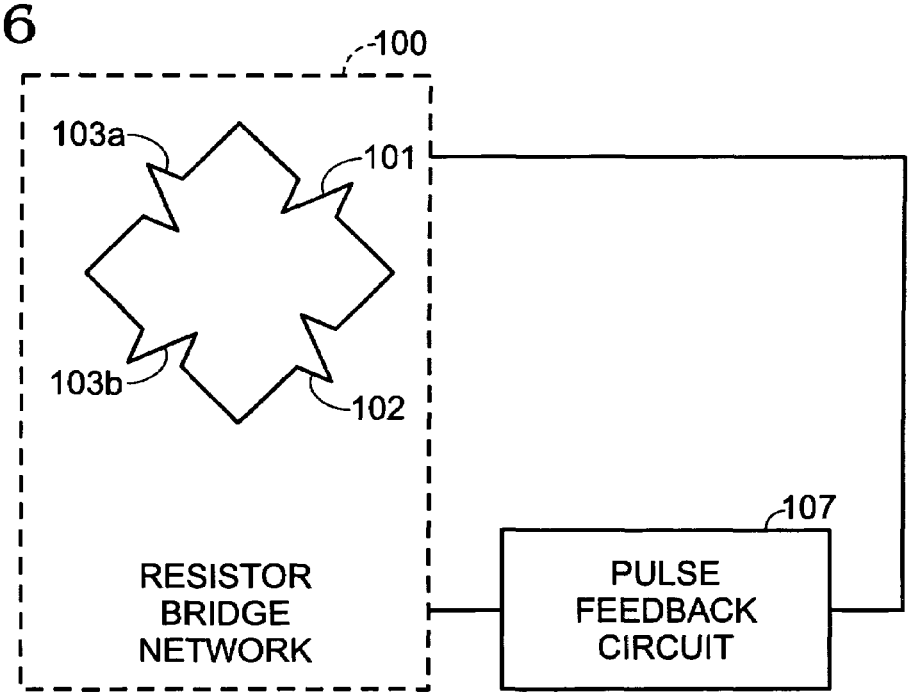
FIG. 6 shows the first embodiment of the present invention reversible resistor trimming circuit.

The present invention discloses a mono-polarity switchable resistor trimmer circuit to reversibly trim a resistor to match a reference resistor in electronics circuits, comprising two major block circuits as shown in FIG. 6, a resistor network circuit 100 to generate a comparing signal indicating the difference between a matching resistor 101 and a reference resistor 102, and a pulse feedback circuit 107 to generate mono-polarity pulses in response to the comparing signal to adjust the resistance of the matching resistor toward that of the reference resistor. The process can be repeated until the resistances of the matching resistor and the reference resistor are equal. The mono-polarity pulses either have the same polarity in the event that the programmable resistance materials require pulses of the same polarity, or have either positive or negative polarity (some times positive polarity, other times negative polarity) in the event that the programmable resistance materials do not care about the polarity of the applied pulses. With polarity not a parameter in the output pulses of the pulse feedback circuit, the output pulses can have different amplitude, duration, frequency or any combination to modify the resistance of the matching resistor.

The electrical pulses generated by the pulse feedback circuit is controlled by the comparing signal and applied to the matching resistor to adjust the resistance of the matching resistor toward the resistance of the reference resistor. By using a matching resistor made of programmable resistance materials, the present invention provides the resistor trimming in both directions, thus allows the adjustment of resistance over-trimming. Since the reversible resistor trimming circuit is a feedback circuit, the resistance variation can be either linear or non linear. In addition, the reversible resistor trimming circuit can be employed to calibrate the matching resistance at any time to ensure resistance matching against time or temperature drift.

The resistor network 100 comprises a matching resistor 101 fabricated using a programmable resistance material, and a reference resistor 102. The resistance of the matching resistor initially can be higher or lower than the resistance of the reference resistor, and will ultimately be trimmed to match the resistance of the reference resistor. The resistor network is preferably a bridge network that comprises a 4 resistor bridge, including two other equal resistors 103a and 103b. The resistor network forms two connected branches, one branch comprises the matching resistor 101 and one of the equal resistors 103a, and the other branch comprises the reference resistor 102 and the other equal resistor 103b. By applying a voltage to the resistor bridge through these two branches, the voltage across the matching resistor and the reference resistor, called the comparing signal, can indicate the relative value of these two resistors. The sign of the comparing signal can indicate whether the matching resistor is larger or smaller than the reference resistor, and the amplitude of the comparing signal can indicate how large the difference is between these two resistors.

The resistor bridge could further include an amplifier, preferably a differential amplifier or an operational amplifier to amplify the comparing signal. The resistor network could include a comparator circuit which further compares the resistance of the matching resistor and that of the reference resistor and produces a comparing signal output indicative of the difference. The comparator circuit is preferably a differential amplifier, comprising an operational amplifier. The sensitivity of the amplifier circuit controls the precision of the resistor trimming circuit. Highly sensitive amplifier circuit can allow more precision resistor matching due to the sensitivity of the comparing signal.

The output of the resistor network (meaning the comparing signal) is fed into the pulse feedback circuit which produces an electrical pulse to the resistor network to adjust the resistance of the matching resistor to reduce the difference in the resistances as shown by the comparing signal. The pulse feedback circuit is designed to provide the appropriate pulses (e.g. pulse amplitude, pulse duration, number of pulses) to induce the appropriate resistance change in the matching resistor. For example, the pulse feedback circuit provides the pulses with the correct amplitude for reversing resistance change for materials where the direction of the resistance change depends on the amplitude of the induced pulses; and provides the pulses with the correct duration for materials where the direction of the resistance change depends on the duration of the induced pulses. The pulse feedback circuit is preferably a programmable pulse generator, controlled by the comparing signal. The electrical pulse provided by the pulse feedback circuit is preferably voltage pulses, but can be current pulses. The number of pulses can also be controlled to improve the damping of the resistance oscillation.

The material of the matching resistor used in the present invention is a programmable resistance material such as perovskite materials exhibiting colossal magnetoresistive effect or high temperature superconducting effect (such as PCMO), and phase change material (such as chalcogenide materials).

Phase change materials used in resistive memory devices are normally employing the resistivity difference in different phases of the materials where typically a crystalline phase exhibits low resistivity and an amorphous phase exhibits higher resistivity.

Examples of these phase change materials were provided by Ovshinky et al., in U.S. Pat. Nos. 3,271,591; 3,530,441; 5,166,758; 5,296,716; 5,335,219; 5,534,711; 5,536,947; 5,596,522; 5,687,112 and 5,912,839, the disclosures of which are incorporated by reference herein. The disclosed phase change materials include at least one chalcogen and may include one or more transition metals. The term "chalcogen" refers to the elements in group V1 of the periodic table. Chalcogenide alloys contain at least one of these elements such as the alloys of germanium, antimony, or tellurium. The term "transition metal" refers to the elements with the atomic number 21–30, 39–48, 57 and 72–80, such as Cr, Fe, Ni, Nb, Pd, and Pt. An example of the phase change materials is a Te-Ge-Sb ternary system with the average concentration of Te from about 48% to about 58%, average concentrations of Ge from about 8% to about 40%, and the remainder is Sb. The resistance of this phase change material is a function of the applied pulse voltages, reversibly and repeatably. Typically the applied voltage pulses have a pulse width that is between 25 to 250 ns. The resistance of this programmable resistance material can be adjusted to a target value by varying the voltage pulse amplitude. Thus, the resistance of a matching resistor can be adjusted by the selection of suitable voltage amplitude. Buckley et al. in U.S. Pat. No. 3,886,577 also discloses a chalcogenide material in which the resistor can be set to a low resistance value after an electrical pulse with sufficiently high voltage and sufficiently long duration is applied, and afterwards, if a high current and shorter duration electrical pulse is applied, the resistor may be set to a high resistance value.

PCMO belongs to a class of materials having perovskite structure such as colossal magnetoresistive (CMR) materials, or high temperature superconductivity (HTSC) materials that can have their resistance changed by an external electric field, thus can be used in the present invention as the programmable resistance material. HTSC materials such as $PbZr_xTi_{1-x}O_3$, YBCO (Yttrium Barium Copper Oxide, $YBa_2Cu_3O_7$ and its variants), have their main use as a superconductor, but since their conductivity can be affected by an electrical current or a magnetic field, these HTSC materials can also be used as matching resistors in the present invention. Examples of perovskite materials employed in resistive memory devices were provided in U.S. Pat. No. 6,204,139 of Liu et al., and U.S. Pat. No. 6,473,332 of Ignatiev et al., hereby incorporated by reference. The disclosed perovskite materials useful in the memory devices are characterized by a programmable resistance through the application of electrical pulses and an increase or decrease in the resistance of the material depends on the properties of the applied electrical pulses.

Typical perovskite materials having CMR effect are the manganite perovskite materials of the $Re_{1-x}Ae_xMnO_3$ structure (Re: rare earth elements, Ae: alkaline earth elements) such as $Pr_{0.7}Ca_{0.3}MnO_3$ (PCMO), $La_{0.7}Ca_{0.3}MnO_3$ (LCMO), $Nd_{0.7}Sr_{0.3}MnO_3$ (NSMO). The rare earth elements are La, Ce, Pr, Nd, Pm, Sm, Eu, Gd, Tb, Dy, Ho, Er, Tm, Yb, and Lu. The alkaline earth metals are Be, Mg, Ca, Sr, Ba, and Ra.

Suitable programmable resistance materials for the present invention include CMR materials and HTSC materials such as PrCaMnO (PCMO), LaCaMnO (LCMO), LaSrMnO (LSMO), LaBaMnO (LBMO), LaPbMnO (LPMO), NdCaMnO (NCMO), NdSrMnO (NSMO), NdPbMnO (NPMO), LaPrCaMnO (LPCMO), and GdBaCoO (GBCO).

FIG. 7 shows the block diagram of another embodiment of the present invention reversible resistor trimming circuit. This embodiment further comprises an input transmission gate 131 and an output transmission gate 133, in addition to the resistor bridge network 130, and the pulse feedback circuit 132.

The transmission gates 131 and 133 are provided between the resistor bridge network 130 and the pulse feedback circuit 132, to serve as an isolation between the resistor bridge network 130 and the pulse feedback circuit 132. The transmission gates 131 and 133 further comprise control signals 151 and 153 for controlling the transmission gates 131 and 133 respectively. When the gate control 151 closes, the input transmission gate 131 is off and the resistor network 130 is isolated from the input of the pulse feedback circuit 132. When the gate control 153 closes, the output transmission gate 133 is off and the resistor network 130 is isolated from the output of the pulse feedback circuit 132.

The transmission gate is preferably a single transistor with the control signal properly biased to turn on and off the transistor. The transmission gate transistor is preferably a field effect transistor going from source to drain (or drain to source, since field effect transistor is largely symmetric) with the control signal connected to the gate. When the gate control is pulsed high, the transistor conducts, and the transmission gate opens. When the gate control is pulsed low, the transistor does not conduct, and the transmission gate closes.

The pulse feedback circuit 132 is designed to take the comparing signal generated by the resistor network 130 and to provide an electrical pulse back to the resistor network to modify the matching resistor. Thus the transmission gates 131 and 133 provide the needed isolation of the pulse feedback circuit 132. The timing of the two transmission gates 131 and 133 is therefore preferably mutual exclusive. When the transmission gate 131 is open, the transmission gate 133 is close and vice versa. In a preferred operation, the input transmission gate 131 is pulsed open for the resistor network 130 to compare the resistance states of the resistor bridge and to generate a comparing signal. The output transmission gate is pulsed open during the close of the input transmission gate to propagate the mono-polarity electrical pulse signal to the resistor network 130 to modify the matching resistor. The pulses used to control the transmission gates are repetitive, meaning the sequence of pulsing open the input transmission gate,
transmitting the comparing signal to the pulse feedback circuit,
pulsing close the input transmission gate,
pulsing open the output transmission gate,
transmitting the mono-polarity electrical pulse to the resistor network,
pulsing close the output transmission gate are repeated to slowly adjusting the resistance of the matching resistor toward that of the reference resistor.

The pulse feedback circuit 132 can be designed to generate mono-polarity electrical pulse signal of different amplitudes, a high amplitude to change the resistance of the matching resistor in one way, and a lower amplitude to change the resistance of the matching resistor in the other way. For example, in the case of chalcogenide materials, a high amplitude pulse can be used to increase the resistance of the matching resistor, and a low amplitude pulse can be used to decrease the resistance of the matching resistor. To produce different pulse amplitudes, the feedback circuit preferably comprises two different supply voltages to provide for the different amplitudes for the mono-polarity electrical pulse signal. The high amplitude is preferably between 4 V to 10 V, and the lower amplitude is preferably between 2 V to 6 V, and preferably 2 V to 4 V.

The pulse feedback circuit 132 can be designed to generate mono-polarity electrical pulse signal of different durations, a short duration to change the resistance of the matching resistor in one way, and a longer duration to change the resistance of the matching resistor in the other way. For example, in the case of chalcogenide materials, a short duration pulse can be used to increase the resistance of the matching resistor, and a long duration pulse can be used to decrease the resistance of the matching resistor. To produce different pulse durations, the transmission gates preferably have different gate opening durations to provide the different durations for the mono-polarity electrical pulse signal. The short duration is preferably between 10 ns to 10 μs, and the long duration is preferably between 1 μs to 1 ms.

FIG. 8 shows a preferred detail block diagram for the precision resistance trimming system for mono-polar switchable PCMO resistor, comprising a resistance bridge 230, an input transmission gate G1 231, a pulse feedback circuit 232 and an output transmission gate G2 233.

The resistance bridge 230 comprises a matching resistor $R_T$ and a reference resistor $R_R$, together with 2 equal resistors R. The matching resistor $R_T$ is made of mono-polarity programmable resistance material such as PCMO, or phase change material whose resistance increases or decreases not depending on the polarity of the applied pulse but on the pulse amplitude or duration. A bias voltage Vbridge/ground is applied to two ends RC and RD of the resistance bridge, dividing the 4 resistors into 2 branches, each branch comprising one of the two equal resistors R. Shown in this figure is the two equal resistors R connected to ground in the resistance bridge, but these two equal resistors R can be connected to Vbridge, providing that they are in different branches. This bias voltage Vbridge will generate two voltages VRA and VRB in nodes RA and RB of the resistance bridge. When these two voltages VRA and VRB are equal, the resistances of the matching resistor and the reference resistor are matched. When the resistance of the matching resistor is higher, i.e., $R_T>R_R$, voltage at node RA is higher than voltage at node RB (VRA>VRB) and the voltage at A is positive. When the resistance of the matching resistor is lower, i.e., $R_T<R_R$, voltage at node RA is lower than voltage at node RB (VRA<VRB) and the voltage at A is negative. The voltage at A is the comparing signal after propagated through the transmission gate G1 231. If the applied voltage Vbridge/ground is reverse, meaning the ground is at node RD and the Vbridge is at node RC, the polarity of the comparing signal is also reverse, meaning VA>0 when $R_T>R_R$, and VA<0 when $R_T<R_R$.

In the simplest formation, the transmission gates 231 and 233 each comprises a single transistor. The transmission gates 231 and 233 can also be any state-of-the-art transmission gate such as a parallel configuration of p- and n-channel transistors.

The pulse feedback circuit 232 takes the comparing signal from the resistance bridge 230 through the input transmission gate G1 231 to a high gain operational amplifier HOA to amplify the difference between the matching resistance and the reference resistance. The amplifier HOA can also be any state-of-the-art comparator circuit, which compares two input values and outputs a signal depending on the difference of those input values. The circuit is then divided into two branches, one positive branch for positive signal (VB>0, meaning VA<0 and $R_T<R_R$) and one negative branch for negative signal (VB<0, meaning VA>0 and $R_T>R_R$). The positive branch comprises a voltage level shift circuit LS1 and an inverter 243 (optional, depending on signal), and the negative branch comprises a different level shifter LS2, an inverter 245 and a one-bit counter 1BCounter, which converts two input pulses to one pulse. The 1BCounter may be replaced with higher bit counter if longer pulse width pulse is required to trim the resistor to the lower resistance value. The one-bit counter 1BCounter uses a voltage level V1 for the low voltage (and wide pulse) needed to reduce the resistance. The two branches converge using a unit gain operational amplifier UOA. The amplifier UOA uses a voltage level V2 which is equal or higher than voltage supply, V. The pulse amplitude at the output of UOA is equal to V and V1 for positive and negative pulses, respectively. The supply voltage V of 243 and V1 of 1BCounter are adjusted for the required resistance trimming voltages. The output of the pulse feedback circuit 232 is finally fed to the output transmission gate G2 233 to modify the resistance of the matching resistor.

The two branch circuit deals exclusively with the two conditions of the matching resistor. The positive branch deals only with the positive signal, thus converts all negative signals to zero. Similarly, the negative branch deals only with the negative signal, thus converts all positive signals to zero. Inverters might be needed to help maintaining the proper polarity.

The positive branch employs a level shifter circuit LS1, shifting down and saturating the comparing signal (positive and negative signal) toward a negative voltage supply V level. The negative voltage is then converted to −V. The positive voltage of the comparing signal will be maintained at a positive voltage. The output is then passed through an inverter, and therefore the positive/negative comparing signal will drop off the negative portion, and the positive portion will be negated to negative signal. FIG. 9 is the circuit diagram for the level shifter LS1 consisting of NMOS transistors T1, T2, and T3, driving an inverter, T4 and T5. The pulse waveform is also sketched. When the input is at the ground or negative potential, the driver transistor T2 is either turned off or at very low drain current. Therefore the output voltage is about −V. A positive voltage pulse at the input may turn on the driver transistor T2 and produce a positive going voltage pulse. T1 and T3 act as a voltage divider. Assuming the channel width of T2 is much wider than that of T1 and the channel width of T3 is larger than that of T2, the output voltage pulse amplitude can be larger than V to ensure that the positive pulse is above the zero level. The inverter supply voltage is selected to be 0V and −V, therefore, when the input of the level shifter LS1 is negative or at ground potential the inverter output is at the ground potential, and when the input voltage of the level shifter LS1 is positive, the inverter output is equal to −V as is shown in the figure.

Figure 10:
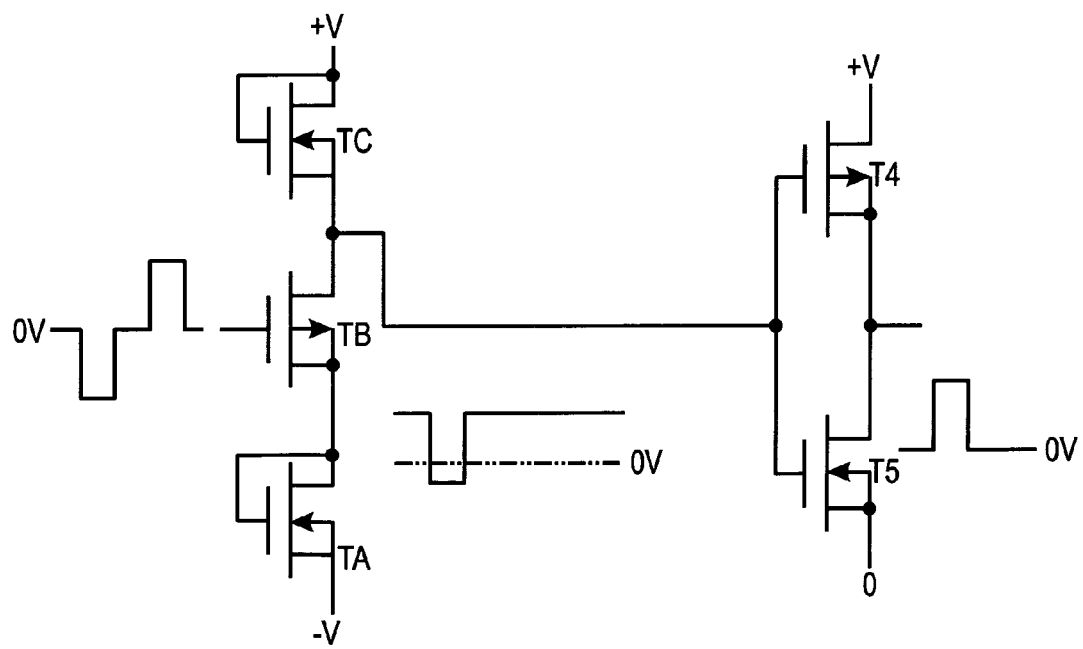
FIG. 10 shows another embodiment of a level shifter in the present invention.

The negative branch employs a level shifter circuit LS2, shifting up and saturating the comparing signal (positive and negative signal) toward a positive voltage supply V level. The positive voltage is then converted to V. The negative voltage of the comparing signal will be maintained at a negative voltage. The output is then passed through an inverter, and therefore the positive/negative comparing signal will drop off the positive portion, and the negative portion will be negated to positive signal. FIG. 10 is the circuit diagram for the level shifter LS2 consists of NMOS transistors TA, TC, and PMOS drive transistor TB. The voltage level shifter drives an inverter, T4 and T5. The pulse waveform is also sketched. When the input is at the ground potential or at positive voltage, the driver transistor TB is either turned off or at very low drain current. Therefore the output voltage is about +V. A negative voltage pulse at the input may turn on the driver transistor, TB, and produce a negative going voltage pulse. TA and TC act as a voltage divider. If the width of TA is much wider than that of TC and the width of TB is larger than that of TA, the output voltage pulse amplitude will be larger than V, ensuring that the negative pulse is below zero level. The inverter supply voltage is +V and 0. Therefore, when the input of the level shifter LS2 is positive or at ground potential, the inverter output is about 0V. When the input voltage of the level shifter LS2 is negative, the inverter output is at about the +V potential as is shown in the figure.

The level shifters LS1 and LS2 as described above can be successful in separating the two branches of the signal corresponding to the polarity of the comparing signal. For the two branches to achieve different pulse durations, additional circuit is necessary. The short pulse can be accomplished by the pulse duration of the transmission gate G1 231 and the long pulse can be accomplished by the pulse duration of the transmission gate G2 233. For the circuit to achieve the long pulse, one of the branch circuits, for example the negative branch, further comprises a one-bit counter circuit to convert two pulses into one. Thus for short pulse, the frequency of the modifying pulse to adjust the matching resistance is the same as the frequency of the input transmission gate G1 231, and the frequency of the long modifying pulse to adjust the matching resistance is half of the frequency of the input transmission gate G1. The one-bit counter can employ a different power supply V1 so that the long pulses can have different, preferably lower, voltage amplitude. There are various one bit counter designs with the typical design being an edge triggered flip-flops such as RS flip-flop, JK flip-flip, D flip-flops. The edge triggered flip-flop changes state at the trigger pulse edge, therefore converting two input pulses to one pulse.

Figure 11:
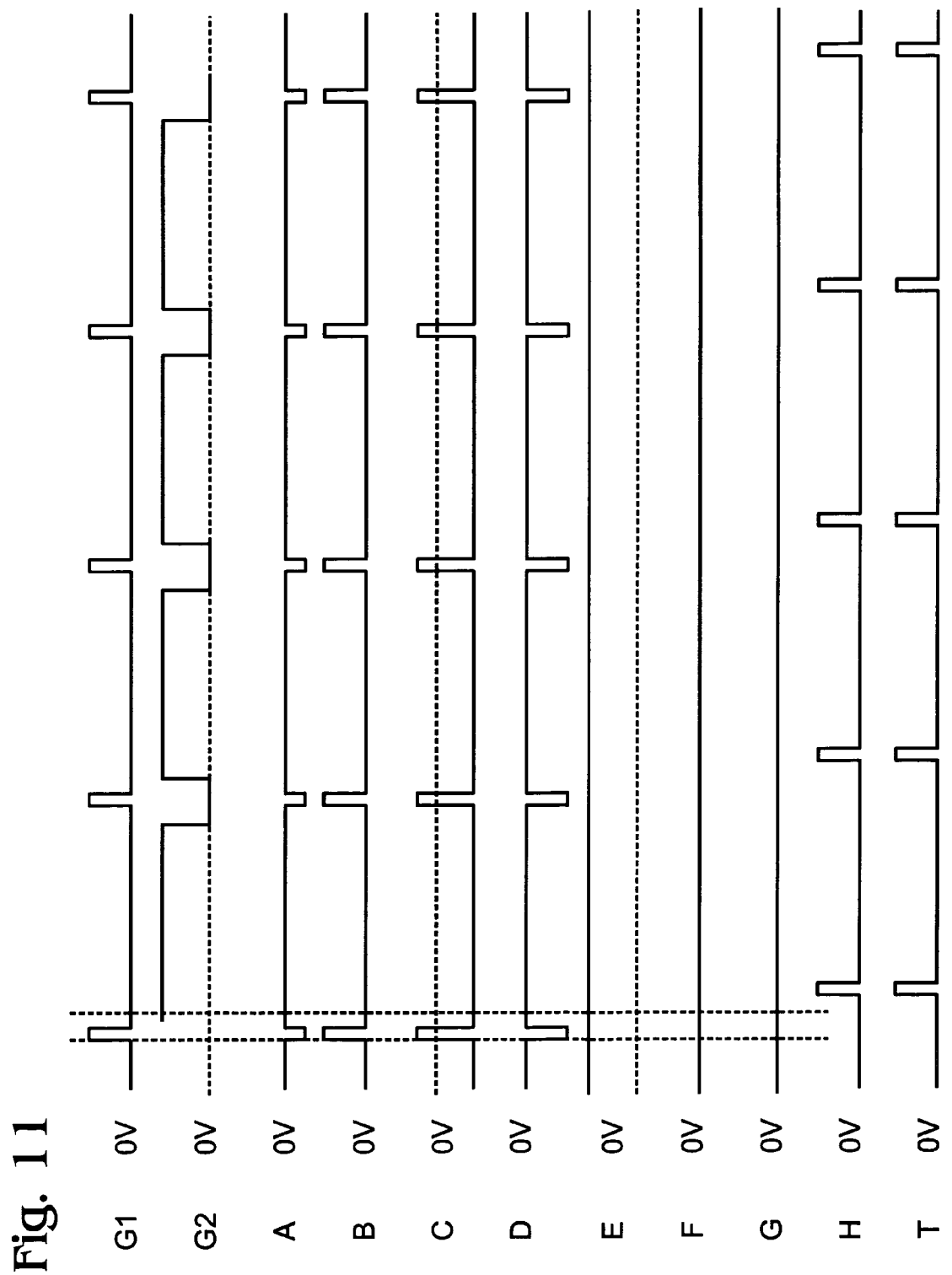
FIG. 11 shows the circuit timing for the case of the resistance of the matching resistor $R_T$ is lower than that of the reference resistor $R_R$ ($R_T<R_R$) acording to the schematic of FIG. 8.
Figure 12:
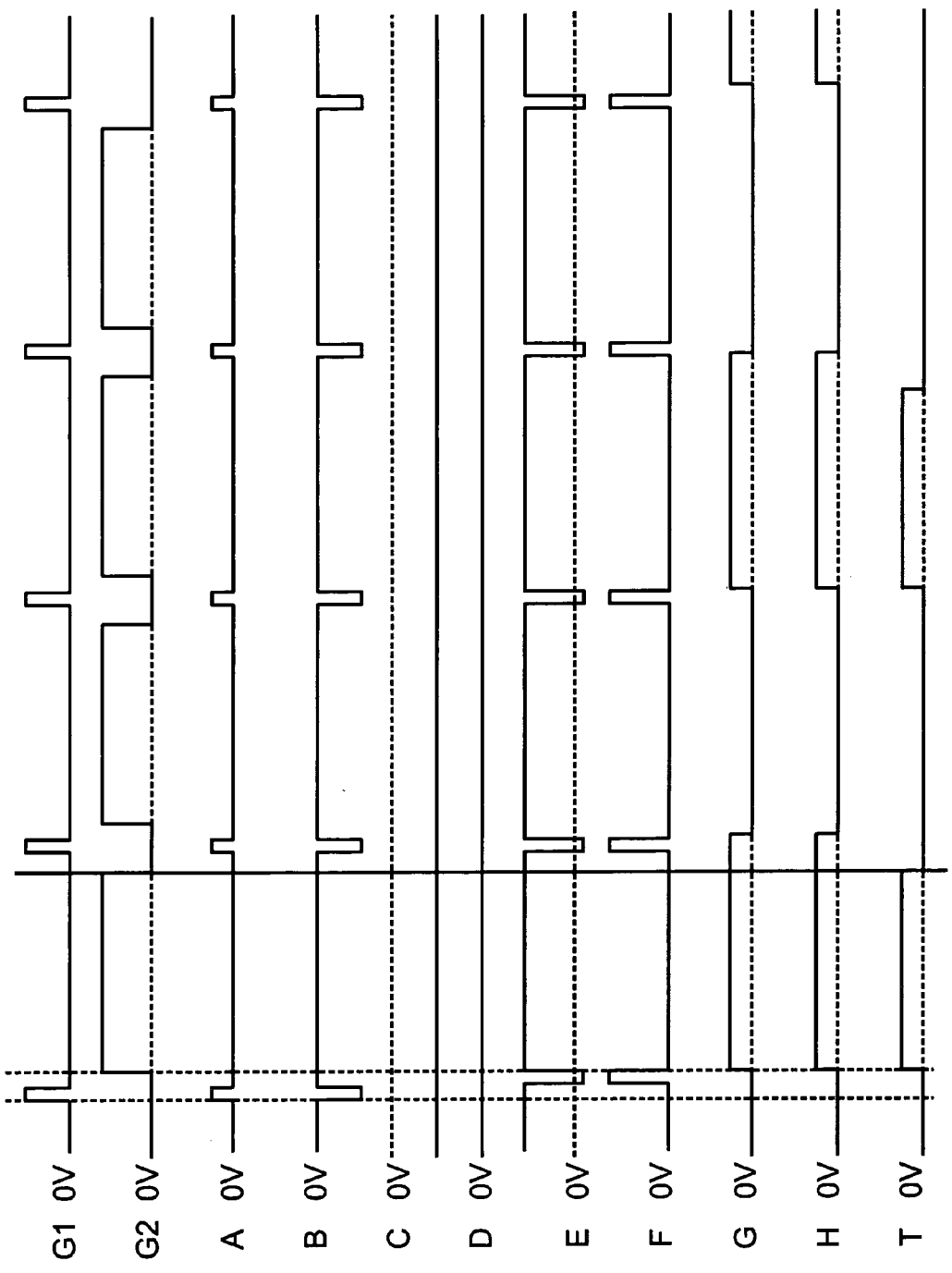
FIG. 12 shows the circuit timing for the case of the resistance of the matching resistor $R_T$ is higher than that of the reference resistor $R_R$ ($R_T>R_R$) acording to the schematic of FIG. 8.

FIGS. 11 and 12 sketch the pulse waveforms at various nodes of the resistance trimming circuit for $R_T$ smaller than $R_R$, and $R_T$ larger than $R_R$, respectively. These two figures show that when the resistor to be trimmed has a resistance that is smaller than that of the reference resistor, a narrow pulse having pulse width equal to that of G1 and amplitude equal to V2 is generated and feedback to $R_T$. When the resistance of the trimming resistor is larger than that of reference resistor, a wide pulse having pulse width equal to that of G2 and amplitude equal to V1 is generated and is fed back to the trimming resistor. Properly adjusting G1 and G2 pulse widths and voltage V1 and V2 can trim the resistor to the precision of the high gain operational amplifier.

The timing of the transmission gates G1 and G2 is repetitive and mutual exclusive, as shown in FIGS. 11 and 12. The repetition of the pulses to open the transmission gates are designed to continuously modify the resistance of the matching resistor. The mutual exclusiveness of the transmission gates is designed to ensure isolation of the pulse feedback circuit to the resistor bridge network. Further, the pulse durations of the two transmission gates are designed to be different to accommodate the resistance modification characteristics of the matching resistor. Typically, the input transmission gate pulse duration is short, resulting in a short (and possibly high amplitude) pulse to increase the resistance of the matching resistor. The output transmission gate pulse duration is long, resulting in a long (and possibly low amplitude) pulse to decrease the resistance of the matching resistor. The exact configuration of the pulse durations and amplitudes depends on the selected programmable resistance material.

During the pulse opening of the input transmission gate G1, the comparing signal signifying the difference between the matching resistor and the reference resistor can propagate toward the operational amplifier HOA. The pulse at the input of the operational amplifier HOA (node A) would be low if $R_T<R_R$ (FIG. 11), and high if $R_T>R_R$ (FIG. 12). Amplifier HOA is an inverter, therefore the signal at node B would be inverted, high pulse in FIG. 11 and low pulse in FIG. 12. For the positive branch, the signal exiting the level shifter LS1 (node C) would be shifted down and truncated, therefore the high pulse at node B would keep it shape (node C, FIG. 11), but the low pulse at node B would be truncated to −V (node C, FIG. 12). The inverter 243 will invert the pulse signal and thus the signal input to the merger amplifier UOA (node D) will be either a negative pulse (FIG. 11) or zero pulse (FIG. 12). For the negative branch, the signal exiting the level shifter LS2 (node E) would be shifted up and truncated, therefore the high pulse would be truncated to V (node E, FIG. 11), and the low pulse would keep it shape (node E, FIG. 12). The inverter 245 will invert the pulse signal and thus the signal input to the merger amplifier UOA (node F) will be either a zero pulse (FIG. 11) or positive pulse (FIG. 12). The signal further passes through an one bit counter, thus the positive signal at node F will be converted to a longer pulse (combining two pulses into one) with a different voltage amplitude based on the power supply V1 of the one bit counter.

The circuit is designed so that one of the inputs to the merger amplifier UOA will be a zero pulse, and therefore the output of the amplifier UOA will be just the amplification of the other input. The signal at node H will either be a short pulse (for $R_T<R_R$), or a long pulse (for $R_T>R_R$). After passing through the output transmission gate G2, the short pulse will not be affected (node T, FIG. 11) but the long pulse will be shorten to the length of the output transmission gate duration (node T, FIG. 12). If after the modification pulse, the resistance of the matching resistor $R_T$ is still not the same as the reference resistor $R_R$, the cycle continues.

While this invention has been described fully and completely, it should be understood that within the scope of the appended claims, the invention may be practiced otherwise than as specifically described. Although the invention has been disclosed with reference to its preferred embodiments, from reading this description those skilled in the art may appreciate changes and modifications that may be made which do not depart from the scope and spirit of the invention as described above and claimed hereafter.

What is claimed is:

1. A circuit for reversible trimming of a matching resistor to a reference resistor wherein a material of the matching resistor comprises a programmable resistance material with a mono-polarity switchable property, the circuit comprising
    a resistor bridge network including the reference resistor and the matching resistor, wherein the resistor bridge network
        compares the resistance values of the reference resistor and the matching resistor and
        generates a comparing signal indicative of the difference between the reference resistor and the matching resistor; and
    a pulse feedback circuit coupled to the resistor bridge network and providing a mono-polarity electrical pulse signal corresponding to the comparing signal to modify the resistance of the matching resistor toward that of the reference resistor.

2. A circuit as in claim 1 wherein the programmable resistance material is selected from the group of materials consisting of a metal-amorphous silicon-metal material, a phase change material and a thin film perovskite material.

3. A circuit as in claim 1 wherein the mono-polarity switchable property of the programmable resistance material is such that the same polarity of the mono-polarity electrical pulse signal is used to increase and to decrease the resistance of the programmable resistance material.

4. A circuit as in claim 1 wherein the mono-polarity electrical pulse signal has a high amplitude and a short duration to change the resistance of the matching resistor in one way, and a lower amplitude and a longer duration to change the resistance of the matching resistor in another way.

5. A circuit for reversible trimming of a matching resistor to a reference resistor wherein a material of the matching resistor comprises a programmable resistance material with a mono-polarity switchable property, the circuit comprising
    a resistor bridge network including the reference resistor and the matching resistor, wherein the resistor bridge network
        compares the resistance values of the reference resistor and the matching resistor and
        generates a comparing signal indicative of the difference between the reference resistor and the matching resistor;
    an input transmission gate coupled to the resistor bridge network;
    an output transmission gate coupled to the resistor bridge network; and
    a pulse feedback circuit for providing a mono-polarity electrical pulse signal to reversibly modify the resistance of the matching resistor toward that of the reference resistor, the feedback circuit receiving a signal input from the input transmission gate and transmitting the mono-polarity electrical pulse signal to the output transmission gate; wherein the transmission gates provide signal isolation between the resistor bridge network and the pulse feedback circuit.

6. A circuit as in claim 5 wherein the timing of the transmission gates is mutually exclusive.

7. A circuit as in claim 6 wherein the mutually exclusive timing of the transmission gates is such that
    the input transmission gate is pulsed open after the closing of the output transmission gate for the resistor bridge network to transmit the comparing signal; and
    the output transmission gate is pulsed open after the closing of the input transmission gate to propagate the mono-polarity electrical pulse signal to the resistor bridge network.

8. A circuit as in claim 5 wherein the resistor network includes the reference resistor, the matching resistor and two resistors having equal resistances.

9. A circuit as in claim 5 further comprising a differential amplifier to amplify the comparing signal from the resistor bridge network.

10. A circuit as in claim 5 wherein each of the transmission gates is a single transistor.

11. A circuit as in claim 5 wherein the comparing signal input to the input transmission gate and the mono-polarity electrical pulse signal input to the output transmission gate are repetitive.

12. A circuit as in claim 5 wherein the mono-polarity switchable property of the programmable resistance material is such that the same polarity of the mono-polarity electrical pulse signal is used in increasing and decreasing the resistance of the programmable resistance material.

13. A circuit as in claim 5 wherein the mono-polarity electrical pulse signal has a high amplitude to change the resistance of the matching resistor in one way, and a lower amplitude to change the resistance of the matching resistor in other way.

14. A circuit as in claim 13 wherein the high amplitude is between 4 V to 10 V, and the lower amplitude is between 2 V to 6 V.

15. A circuit as in claim 5 wherein the pulse feedback circuit includes two different supply voltages which are adjustable to provide resistance trimming voltages.

16. A circuit as in claim 15 wherein the two different supply voltages are between 4 V to 10 V and between 2 V to 6 V.

17. A circuit as in claim 5 wherein the mono-polarity electrical pulse signal has a short duration to change the resistance of the matching resistor in one way, and a longer duration to change the resistance of the matching resistor in other way.

18. A circuit as in claim 17 wherein the short duration is between 10 ns to 10 µs, and the longer duration is between 1 µs to 1 ms.

19. A circuit as in claim 17 wherein the longer duration is accomplished with a one-bit counter or a higher-bit counter.

20. A circuit as in claim 5 wherein the transmission gates have different gate opening durations and the different gate opening durations of the transmission gates provide the different durations for the mono-polarity electrical pulse signal.

21. A circuit as in claim 5 wherein the pulse feedback circuit comprises two branch circuits and a branch selector circuit to combine the outputs from these two branch circuits, the two branch circuits comprising a first matching resistance branch and a second matching resistance branch, wherein the first matching resistance branch circuit receives the comparing signal indicating one status of the matching resistance and generates the mono-polarity electrical pulse having high amplitude or short duration or both; and the second matching resistance branch circuit receives the comparing signal indicating another status of the matching resistance and generates the mono-polarity electrical pulse having low amplitude or long duration or both.

22. A circuit as in claim 21 wherein the branch selector circuit comprises an amplifier.

23. A circuit as in claim 21 wherein the first matching resistance branch circuit comprises a level shifter circuit.

24. A circuit as in claim 21 wherein the second matching resistance branch circuit comprises a level shifter circuit and a one-bit counter or a higher bit counter.

25. A circuit as in claim 5 wherein the programmable resistance material is selected from the group of materials consisting of a metal-amorphous silicon-metal material, a phase change material and a thin film perovskite material.

26. A circuit as in claim 25 wherein the metal-amorphous silicon-metal material comprises boron doped amorphous silicon layer located between two electrodes, one electrode being Cr and the other being V, Co, Ni, Pd, Fe or Mn.

27. A circuit as in claim 25 wherein the phase change material comprises at least one chalcogen and one or more transition metals.

28. A circuit as in claim 25 wherein the thin film perovskite material is selected from a group of materials consisting of colossal magnetoresistive materials and high temperature superconducting materials.

29. A circuit as in claim 25 wherein the thin film perovskite material is selected from the group of perovskite materials consisting of PrCaMnO (PCMO), LaCaMnO (LCMO), LaSrMnO (LSMO), LaBaMnO (LBMO), LaPbMnO (LPMO), NdCaMnO (NCMO), NdSrMnO (NSMO), NdPbMnO (NPMO), LaPrCaMnO (LPCMO), and GdBaCoO (GBCO) and mixtures and combinations thereof.

30. A method of reversible trimming of a matching resistor to a reference resistor wherein a material of the matching resistor comprises a programmable resistance material with a mono-polarity switchable property, the method comprising comparing the matching resistor to the reference resistor;

generating a comparing signal indicative of the difference between the reference resistor and the matching resistor;

generating a mono-polarity electrical pulse signal from a pulse feedback circuit connected to the matching resistor, the electrical pulse signal corresponded to the comparing signal; and applying the mono-polarity electrical pulse signal to the matching resistor to modify the resistance of the matching resistor toward that of the reference resistor.

31. A method as in claim 30 wherein the pulse feedback circuit is connected to the matching resistor through input and output transmission gates which provide electrical signal isolation during the period of resistor comparing and resistor modifying.

32. A method as in claim 30 wherein the mono-polarity electrical pulse signal has an amplitude or a duration corresponding to a polarity or an amplitude of the comparing signal from a comparator circuit to reversibly modify the resistance of the matching resistor toward that of the reference resistor.

33. A method as in claim 30 wherein the mono-polarity electrical pulse signal has different pulse duration corresponding to the polarity of the comparing signal.

34. A method as in claim 30 wherein the mono-polarity electrical pulse signal has different pulse amplitudes corresponding to the polarity of the comparing signal.

35. A method as in claim 30 further comprising the repetition of the above steps until the resistances of the matching resistor and the reference resistor are matched.

36. A method as in claim 30 wherein the programmable resistance material is selected from the group of materials consisting of a metal-amorphous silicon-metal material, a phase change material and a thin film perovskite material.

* * * * *